(12) United States Patent
Santacruz-Olivares

(10) Patent No.: US 6,338,570 B1
(45) Date of Patent: Jan. 15, 2002

(54) THERMOELECTRIC COOLING STIRRER

(76) Inventor: Cesar Santacruz-Olivares, Tulia No. 310 Fraco. Tulipanes, Villahermosa, Tabasco, C.P. 86097 (MX)

(*) Notice: Subject to any disclaimer, the term of this patent is extended or adjusted under 35 U.S.C. 154(b) by 0 days.

(21) Appl. No.: 09/535,793

(22) Filed: Mar. 29, 2000

(51) Int. Cl.$^7$ ................................................ B01F 15/06
(52) U.S. Cl. ...................... 366/144; 366/146; 366/147; 224/269; 62/3.3; 62/3.7; 62/293
(58) Field of Search ................................ 224/269, 666; 366/129, 144, 146, 147; 62/3.2, 3.3, 3.6, 3.62, 293, 3.7

(56) References Cited

U.S. PATENT DOCUMENTS

| | | | | |
|---|---|---|---|---|
| 3,146,600 A | * | 9/1964 | Cox | |
| 3,949,915 A | * | 4/1976 | Burhans | |
| 4,301,658 A | * | 11/1981 | Reed | |
| D286,375 S | | 10/1986 | Taub | |
| 4,843,836 A | * | 7/1989 | Childers | |
| D303,320 S | * | 9/1989 | Nagel | |
| 5,136,850 A | * | 8/1992 | Bierschenk et al. | |
| 5,151,720 A | | 9/1992 | Kanbar | |
| 5,255,520 A | * | 10/1993 | O'Geary et al. | |
| D369,502 S | | 5/1996 | Albertson | |
| 5,568,973 A | | 10/1996 | Gorab | |
| 5,878,579 A | * | 3/1999 | Boyer, III | |
| 6,158,224 A | * | 12/2000 | Hu et al. | |

* cited by examiner

Primary Examiner—Joseph W. Drodge
Assistant Examiner—Terry K. Cecil
(74) Attorney, Agent, or Firm—Michael I Kroll

(57) ABSTRACT

A thermoelectric stirrer for cooling a substance includes a housing formed of thermoelectric material for absorbing heat from the substance and includes a conduit 38 between an input port 18 and an output port 20. A fan 36 is positioned adjacent the input port and is adapted to draw air into the conduit. The air carries heat absorbed by the housing through the output port. A switch 26 is provided for selectively controlling power to the stirrer. A clip 22 is provided to engage the rim of a container and another clip 58 is provided to secure the stirrer to the clothing of a user.

12 Claims, 10 Drawing Sheets

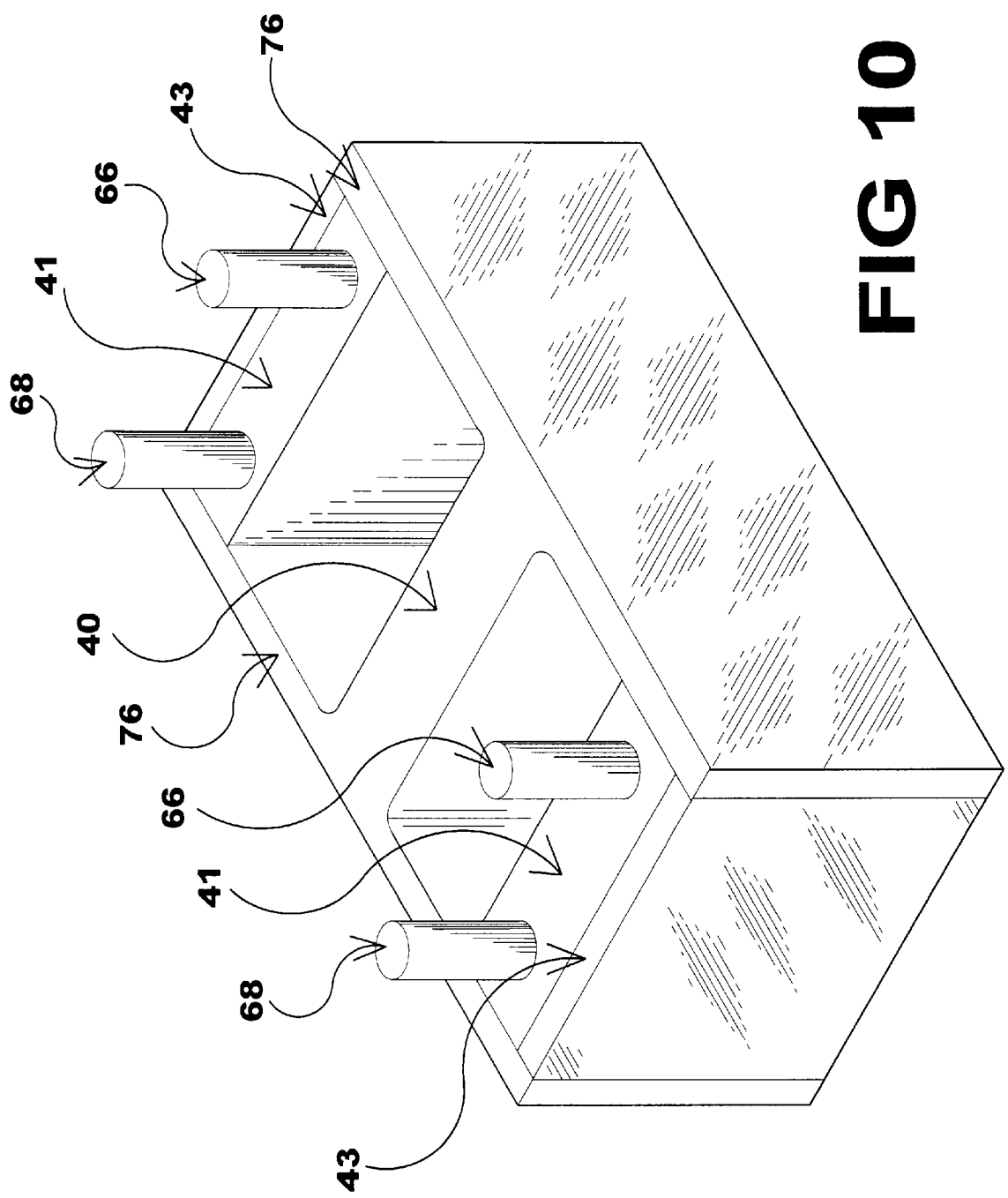

THERMOELECTRIC COOLING STIRRER

BACKGROUND OF THE INVENTION

1. Field of the Invention

The present invention relates generally to heat transfer devices and, more specifically, to a device for cooling a liquid utilizing the Peltier effect for producing localized heat transfer when placed in a container having the liquid therein.

2. Description of the Prior Art

Numerous types of heat transfer devices have been provided in the prior art. For example, U.S. Pat. Nos. Des 286,375; 5,151,720; 5,568,973 and Des 369,502 all are illustrative of such prior art. While these units may be suitable for the particular purpose to which they address, they would not be as suitable for the purposes of the present invention as heretofore described.

U.S. Pat. No. Des. 286,375

Inventor: Hal Taub

Issued: Oct. 28, 1986

This United States Patent discloses an ornamental design for a combined drink stirrer and container for a liquid refrigerant as illustrated in the drawings of the patent.

U.S. Pat. No. 5,151,720

Inventor: Maurice S. Kanbar

Issued: Sep. 29, 1992

A swizzle stick for stirring mixed drinks, the stick being convertible to a lensless ophthalmic device, making it possible for a typical individual having defective sight to see clearly regardless of the nature of the defect. The swizzle stick includes a strip section having a profile defining a pair of eyepieces joined to a nose piece and a handle extending from one of the eyepieces. Extending from the other eyepiece is a swizzle shank, the junction therebelow being scored so that the shank may be broken off to convert the stick to an ophthalmic device. Each eyepiece has a pattern of pin holes therein adapted to project a clear image of the object viewed by the related eye of the user of the device.

U.S. Pat. No. 5,568,973

Inventor: Glenn N. Gorab

Issued: Oct. 29, 1996

An antifoaming agent is deposited on a stirring or straw element to be placed in a beverage receptacle. The disposition of this material on the element speeds up the pouring process and is useful in high volume environments, such as airlines, convenience stores, and college bars. The preferred material for the antifoam coating is DOW CORNING® Antifoam FG-10, which is a ten percent active, food grade silicone emulsion.

U.S. Pat. No. Des 369,502

Inventor: David V. Albertson

Issued: May 7, 1996

This United States Patent discloses an ornamental design for a liquid cooling stir stick as illustrated in the drawings of the patent.

SUMMARY OF THE PRESENT INVENTION

The present invention relates generally to heat transfer devices and, more specifically, to a device for cooling a liquid utilizing the Peltier effect for producing localized heat transfer when placed in a container having the liquid therein.

A primary object of the present invention is to provide a thermoelectric cooling stirrer that will overcome the shortcomings of prior art devices.

A further object of the present invention is to provide a thermoelectric cooling stirrer which is able to quickly cool the contents of a glass, can, bottle or other container in which it is inserted.

A yet further object of the present invention is to provide a thermoelectric cooling stirrer including a power source and appropriate controlling means for enabling and disabling the cooling system.

An even further object of the present invention is to provide a thermoelectric cooling stirrer including a thermoelectric device which, upon activation, will absorb heat within the container in which the stirrer is inserted.

A still further object of the present invention is to provide a thermoelectric cooling stirrer including a conduit extending therethrough for dissipation of the absorbed heat.

A further object of the present invention is to provide a thermoelectric cooling stirrer including a fan placed within the conduit for rapidly expelling heated air therethrough.

A further object of the present invention is to provide a thermoelectric cooling stirrer including a rechargeable power source allowing the stirrer to be repeatedly and instantaneously reused.

Another object of the present invention is to provide a thermoelectric cooling stirrer that is simple and easy to use.

A still further object of the present invention is to provide a thermoelectric cooling stirrer that is economical in cost to manufacture.

Additional objects of the present invention will appear as the description proceeds.

A thermoelectric cooling stirrer for cooling a substance is disclosed by the present invention. The thermoelectric cooling stirrer includes a housing formed of thermoelectric material for absorbing heat from the substance in which the stirrer is positioned. An input port and an output port are formed in a side of the housing. A conduit extends between the input and output ports and through an inner side of the housing and a fan is positioned in the conduit adjacent to the input port. The fan draws air into the conduit whereby the air traveling through the conduit carries heat absorbed by the housing from the conduit through the output port and out of the stirrer thereby removing heat from the substance in which the stirrer is positioned causing the substance to be cooled. A switch is provided on a side of the housing for selectively connecting a power source to the fan and the thermoelectric devices thereby controlling operation of the stirrer. A first clip extends from a side of the housing for engaging a rim of a container retaining the substance therein. A second retaining clip extends from a side of the housing for releasably securing the thermoelectric cooling stirrer to an article of clothing of a user. A case is provided for storing the stirrer when not in use. The case includes a retaining clip extending from a side thereof for releasably securing the case to an article of clothing of a user.

The foregoing and other objects and advantages will appear from the description to follow. In the description reference is made to the accompanying drawing, which forms a part hereof, and in which is shown by way of illustration specific embodiments in which the invention may be practiced. These embodiments will be described in sufficient detail to enable those skilled in the art to practice

BRIEF DESCRIPTION OF THE DRAWING FIGURES

Various other objects, features and attendant advantages of the present invention will become more fully appreciated as the same becomes better understood when considered in conjunction with the accompanying drawings, in which like reference characters designate the same or similar parts throughout the several views.

Figure 8:
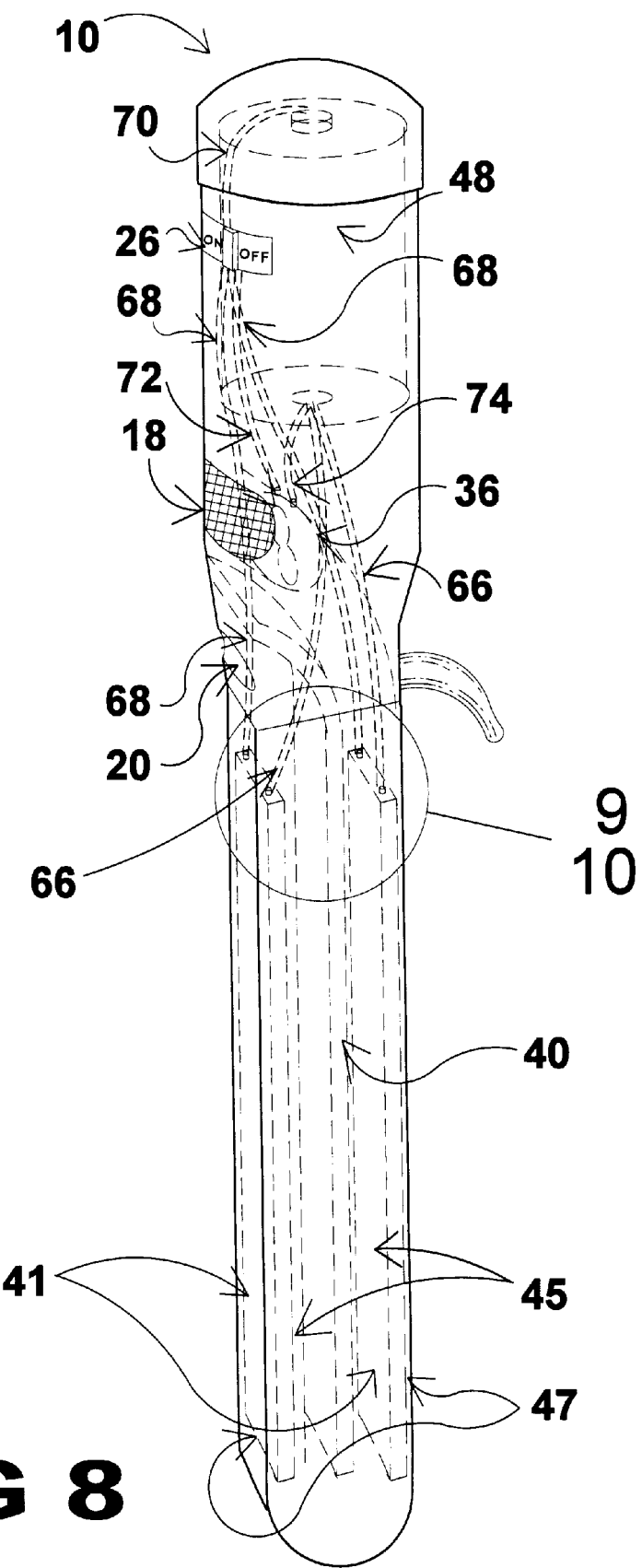
FIG. 8 is a cross-sectional view of the thermoelectric cooling stirrer of the present invention showing the connections between the thermoelectric device and the power source.
Figure 9:
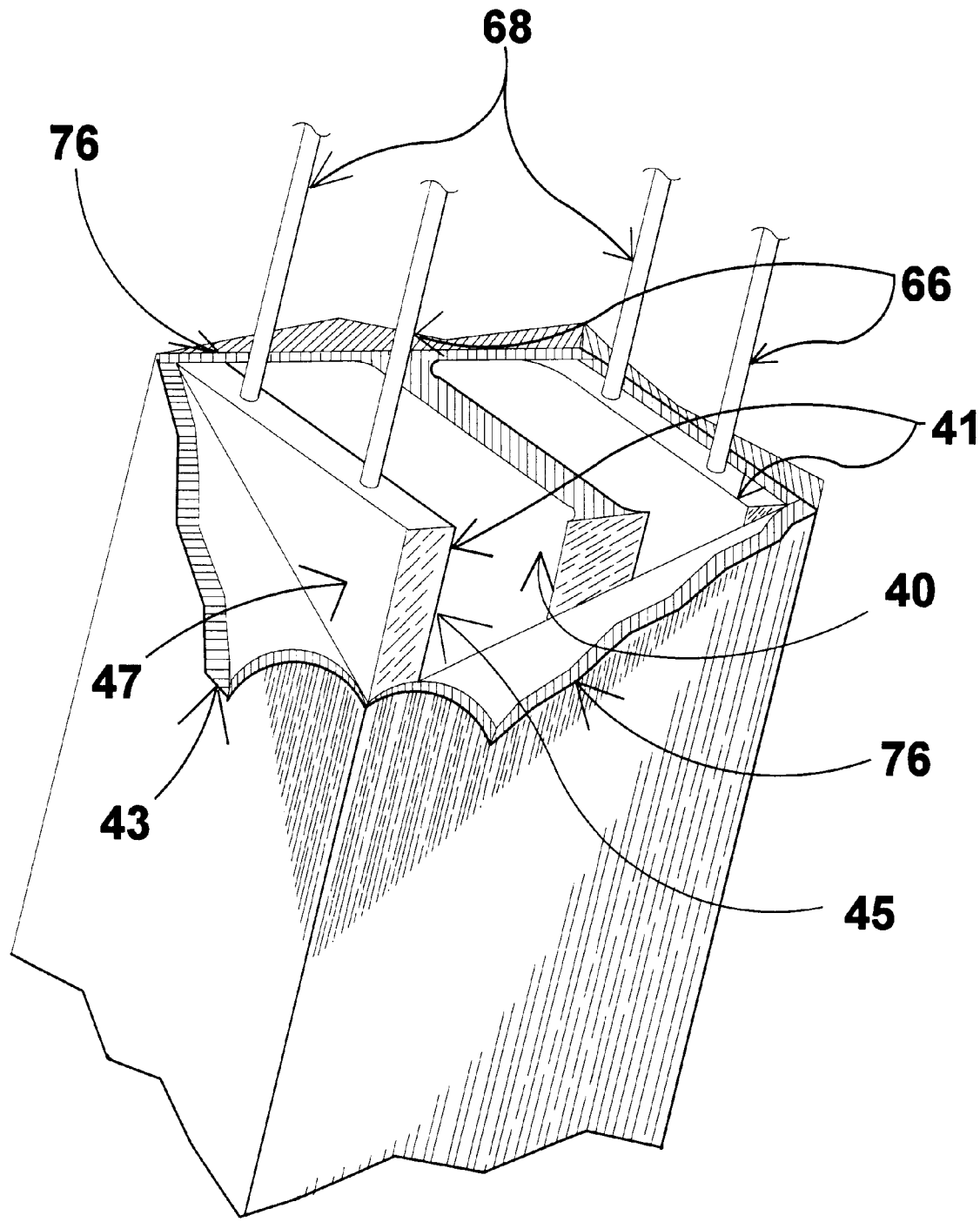

FIG. 9 is a perspective view of the thermoelectric device used in the thermoelectric cooling stirrer of the present invention with the external protective film partially peeled away taken from within the circle labeled 9 of FIG. 8; and FIG. 10 is an enlarged view of the thermoelectric device of the thermoelectric cooling stirrer of the present invention taken from within the circle labeled 10 of FIG. 8.

DESCRIPTION OF THE REFERENCED NUMERALS

Turning now descriptively to the drawings, in which similar reference characters denote similar elements throughout the several views, the Figures illustrate the thermoelectric cooling stirrer of the present invention. With regard to the reference numerals used, the following numbering is used throughout the various drawing figures.

10 thermoelectric cooling stirrer of the present invention
12 glass in which thermoelectric cooling stirrer is positioned
14 liquid within glass
16 housing of thermoelectric cooling stirrer
18 air intake port
20 output port
22 retaining clip
24 edge of glass
26 power switch
28 can in which thermoelectric cooling stirrer is positioned
30 pop top of can
32 top side of can
34 edge of can
36 fan
37 back wall
38 conduit
39 front wall
40 center wall within housing defining conduit
41 thermoelectric material
42 arrows indicating heat absorbed by the thermoelectric material
43 external protector film
44 arrows indicating air flowing through conduit
45 hot side of thermoelectric material
46 top side of housing
47 cold side of thermoelectric material
48 power source
50 cover
52 pocket of user retaining thermoelectric cooling stirrer therein
54 user
56 case for retaining thermoelectric cooling stirrer when not in use
58 clip for securing case in position
60 entrance to case
62 arrow indicating direction of insertion for thermoelectric cooling stirrer
64 clip on top side of thermoelectric cooling stirrer
66 first cable connecting thermoelectric devices to battery
68 second cable connecting thermoelectric devices to power switch
70 wire connecting switch and battery
72 wire connecting switch and fan
74 wire connecting fan and battery
76 adjacent walls

DETAILED DESCRIPTION OF THE PREFERRED EMBODIMENT

Turning now descriptively to the drawings, in which similar reference characters denote similar elements throughout the several views, FIGS. 1 through 10 illustrate the thermoelectric cooling stirrer of the present invention indicated generally by the numeral 10.

Figure 1:
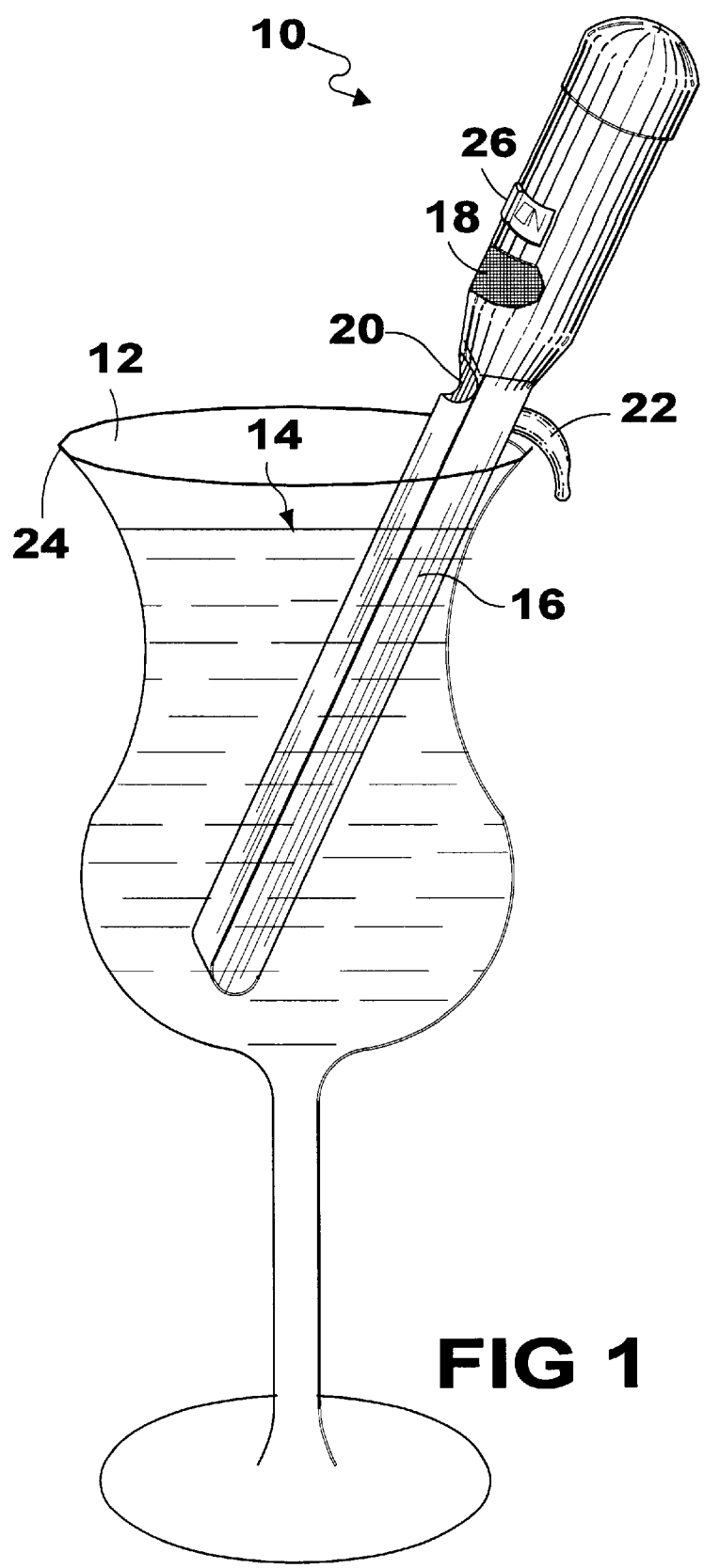
FIG. 1 is a top perspective view of the thermoelectric cooling stirrer of the present invention positioned in a glass containing a liquid.

The thermoelectric cooling stirrer 10 is illustrated in FIG. 1 positioned within a glass 12 filled with a liquid 14 to be cooled. The thermoelectric cooling stirrer 10 has an elongate housing 16 including an air intake port 18 and an output port 20. The air intake port 18 and output port 20 are connected by a conduit extending through the housing 16. A fan is positioned at the air intake port 18 for drawing air in through the air intake port 18 and into the conduit. The conduit and fan will be described hereinafter with specific reference to FIGS. 3 and 4. Extending from one side of the elongate housing 16 is a clip 22 for retaining the position of the thermoelectric cooling stirrer 10 within the glass 12. The clip 22 engages an edge 24 of the glass 12 thereby holding the thermoelectric cooling stirrer 10 in position within the glass 12. The clip 22 prevents the thermoelectric cooling stirrer 10 from falling completely into the glass 12 and being submerged in the liquid 14 or substance within the glass 12. A power switch 26 for activating the thermoelectric cooling stirrer 10 is provided extending from the housing 16. The power switch 26 is manually activated by a user when it is desired to cool the liquid 14 within the glass 12 in which the thermoelectric cooling stirrer 10 is positioned.

Figure 2:
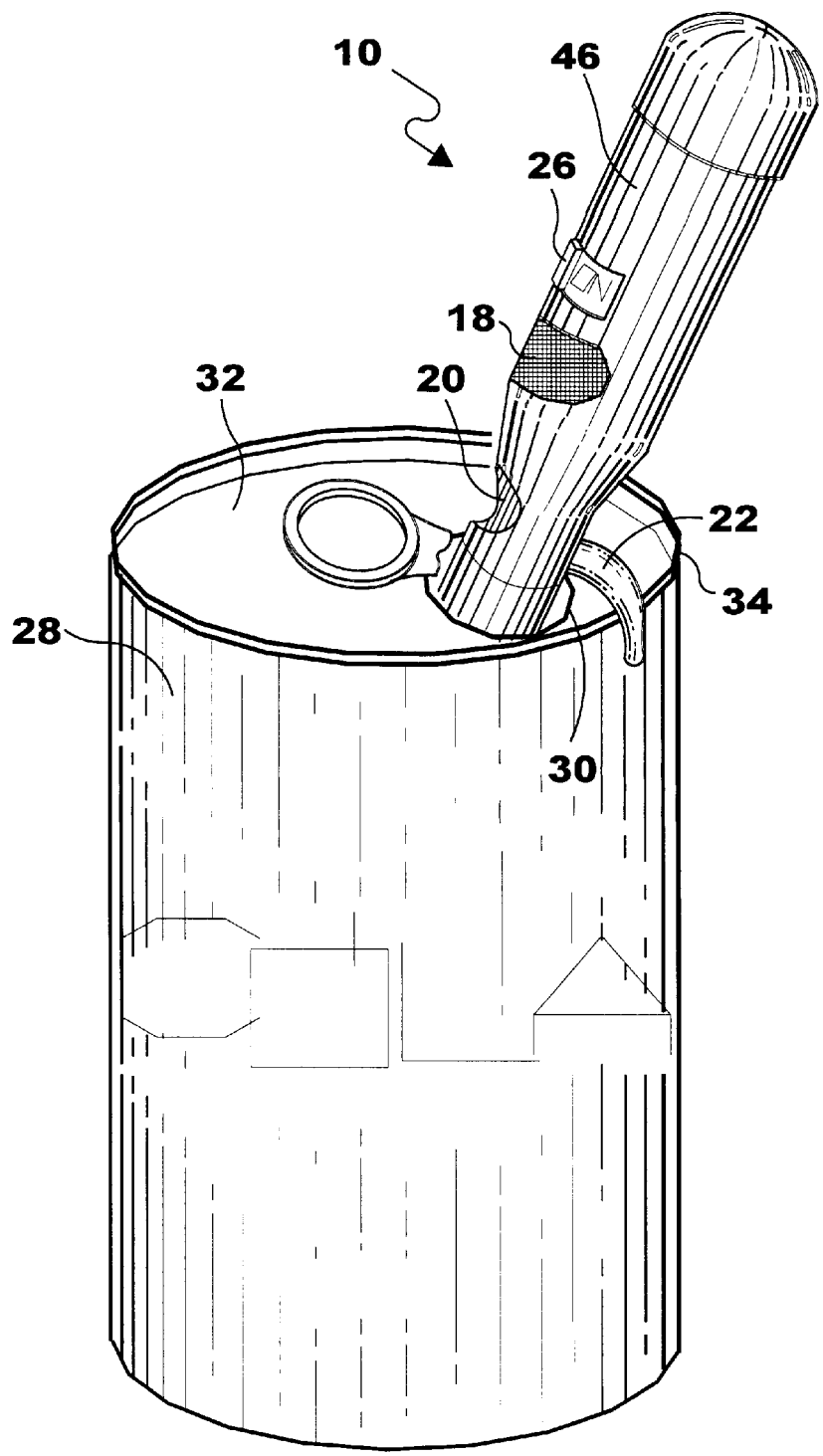
FIG. 2 is a perspective view of the thermoelectric cooling, stirrer of the present invention positioned in a can of soda.

FIG. 2 illustrates the thermoelectric cooling stirrer 10 positioned within a can 28 for cooling the contents of the can 28. The thermoelectric cooling stirrer 10 is positioned to extend through a pop-top 30 on a top side 32 of the can 28 and into the can 28. The clip 22 is positioned to engage with an edge 34 of the can 28 extending around the top side 32.

Figure 3:
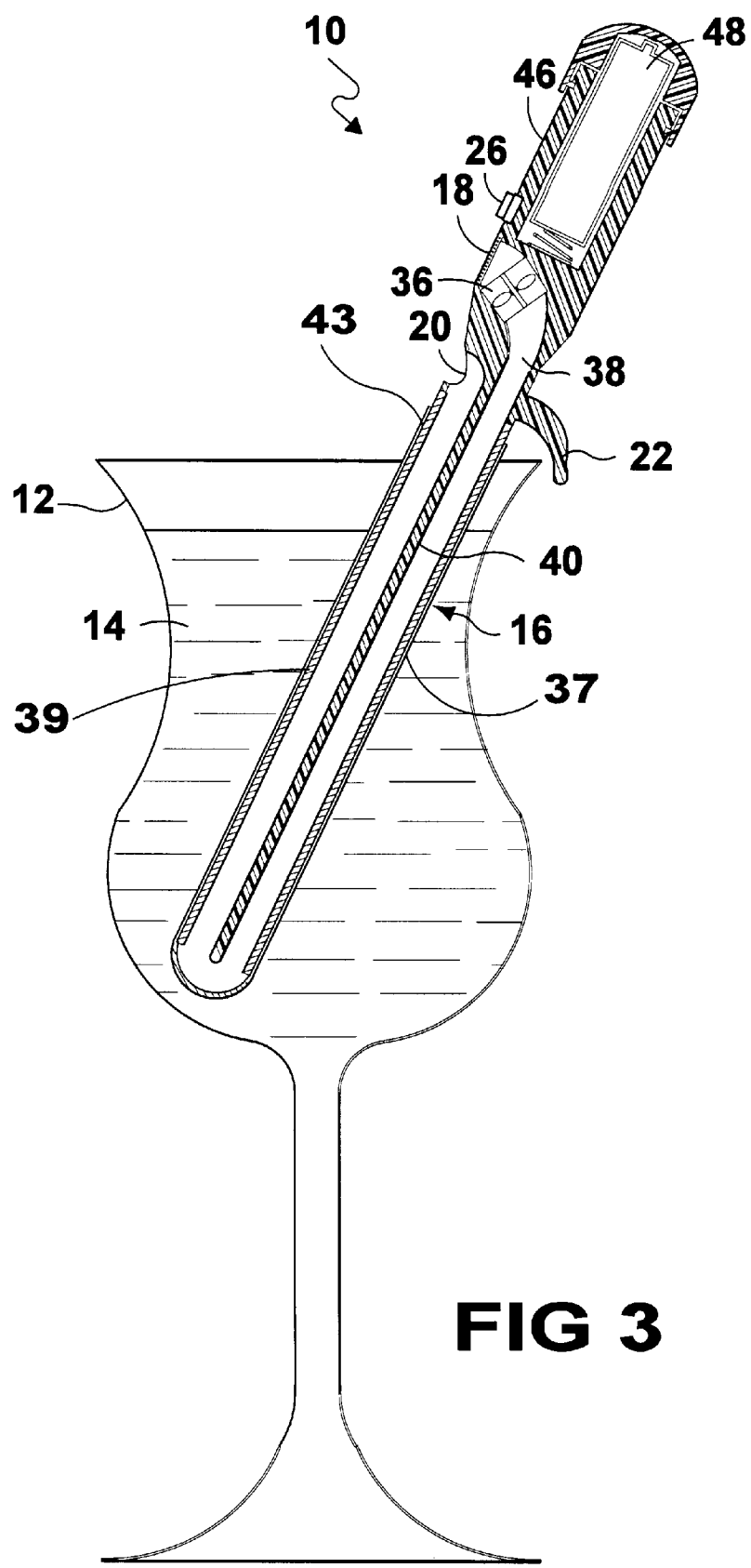
FIG. 3 is a cross-sectional view of the thermoelectric cooling stirrer of the present invention positioned in a glass containing a liquid.
Figure 4:
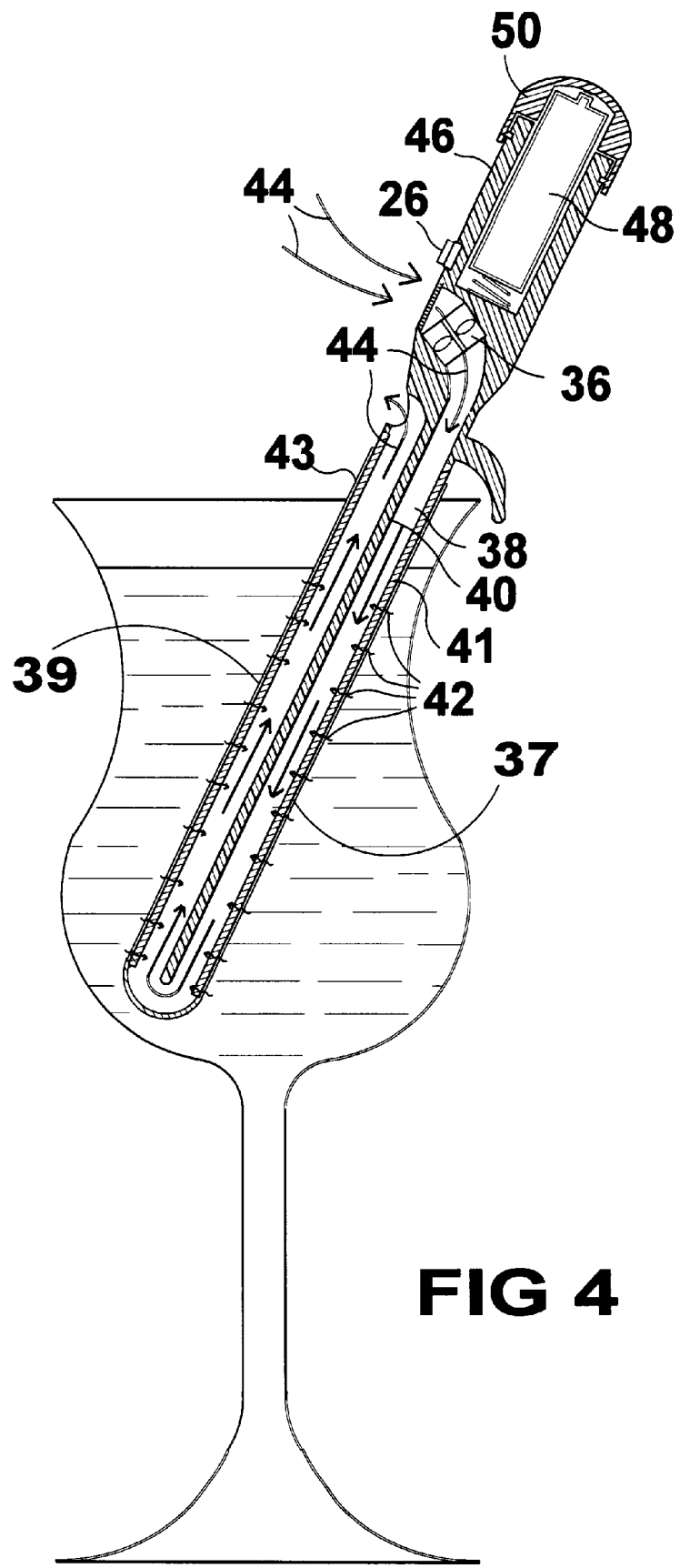
FIG. 4 is a cross-sectional view of the thermoelectric cooling stirrer of the present invention positioned in a glass containing a liquid and showing the flow of air through a conduit.

A cross-sectional view of the thermoelectric cooling stirrer 10 is illustrated in FIGS. 3 and 4. As can be seen from these figures, the fan 36 is positioned within the conduit 38 adjacent to the air intake port 18. A central wall 40 formed by a thermic isolator device extends through a central section of the housing 16 to define the conduit 38. The conduit 38 extends from the air intake port 18 along a back wall 37 of the housing 16 and up a front wall 39 leading to the output port 20. The back wall 37 and front wall 39 are formed from thermoelectric devices 41 and are covered by an external protection film 43. The conduit 38 extends on either side of the wall 40.

The housing 16 is formed by thermoelectric devices 41 with an external protector film 43 which absorbs heat from the substance 14 within the glass 12. An enlarged view of a portion of the housing 16 is illustrated in FIGS. 9 and 10. FIG. 10 illustrates the thermoelectric devices 41 positioned within the housing 16 without the external protection film 43 therearound. FIG. 9 shows the external protection film 43 in a partially peeled away position. As can be seen from these figures, the center wall 40 is positioned between the thermoelectric devices 41 forming the back wall 37 and front wall 39. The conduit extends along either side of the center wall 40. Adjacent walls 76 are positioned to extend along either side of the center wall 40 and between the front wall 39 and back wall 37. The center wall 40 and adjacent walls 76 are formed of a thermic isolator material. The back wall 37 and front wall 39 are formed of thermoelectric devices 41 and the external protection film 43 is provided to surround the back wall 37 and front wall 39. The back wall 37, front wall 39 and adjacent walls 76 form an outside wall. A first cable 66 is provided to extend from opposing sides of the outside wall to connect the thermoelectric devices with the battery 48. A second cable 68 is also provided to extend from opposing sides of the outside wall 41 to connect the thermoelectric devices with the switch 26.

The connection of the battery 48 with the thermoelectric devices 41 and the switch 26 are also illustrated in FIG. 8. This figure illustrates the hot side 45 and cold side 47 of the thermoelectric devices 41. The stirrer 10 is thus used to cool a liquid in which it is partially submerged by reversing the polarity of the power source 48 when used to heat a liquid. When connected to the power source 48 as indicated in FIG. 8, the hot side 45 will heat up and the cold side 47 will cool down thereby heating the air passing through the conduit 38 and cooling the liquid in which the stirrer 10 is positioned. When the thermoelectric devices 41 are connected to the power source 48 with opposite polarity, the hot side 45 will cool down and the cold side 47 will heat up thereby cooling the air passing through the conduit 38 and heating the liquid in which the stirrer 10 is positioned. As can be seen from FIG. 8, the switch 26 is connected to the battery 48 via a connection wire 70. The switch 26 is also connected through a connection wire 72 to the fan 36. The fan 36 is connected to the battery 48 via a connection wire 74. Actuation of the switch 26 into the ON position will apply power to both the fan 36 and the thermoelectric devices 41.

The heat absorbed by the housing 16 and indicated by the arrows labeled 42 in FIG. 4 is transferred to the air passing through the conduit 38. The air passing through the conduit 38 is indicated by the arrows labeled 44. This air becomes heated and is removed through the air output port 20. Thus, the heat absorbed by the housing 16 is removed from the thermoelectric cooling stirrer 10 thereby cooling the liquid 14.

Positioned in a top end 46 of the housing 16 and connected to provide power to the fan 36 and the thermoelectric devices 41 is a power source 48. The power switch 26 is connected between the power source 48 and the fan 36 and between the power source 48 and the thermoelectric devices 41 for selectively supplying power to the fan 36 and the thermoelectric devices 41. When the power source 48 is connected to the thermoelectric devices 41, the thermoelectric devices 41 absorb the heat 42 of the liquid 14. When the power source 48 is connected to the fan 36, the fan 36 is activated to draw air 44 through the conduit 38 and to the output port 20. As the air passes through the conduit 38, it carries the heat absorbed by the thermoelectric devices 41 to the output port 20. A cover 50 is removably connected to the top side 46 of the housing 16 for securing the power source 48 in position. The cover 50 is selectively removed in order to replace or recharge the power source 48.

The housing 16 is formed of a thermoelectric material sandwiched between ceramic plates which are themselves encased within the external shell of the thermoelectric cooling stirrer 10 and an appropriate thermic isolator material forms the center wall 40 and the adjacent walls 76. Thus, the heat flows and is neither absorbed by the device 10 itself nor by the liquid 14. Heat within the liquid 14 is able to be absorbed by the thermoelectric material forming the housing 16 whereby the absorbed heat heats the air flowing through the conduit 38 and is carried out through the output port 20. The heat is thus removed from the liquid and the conduit 38 by the air flowing through the conduit 38.

Figure 5:
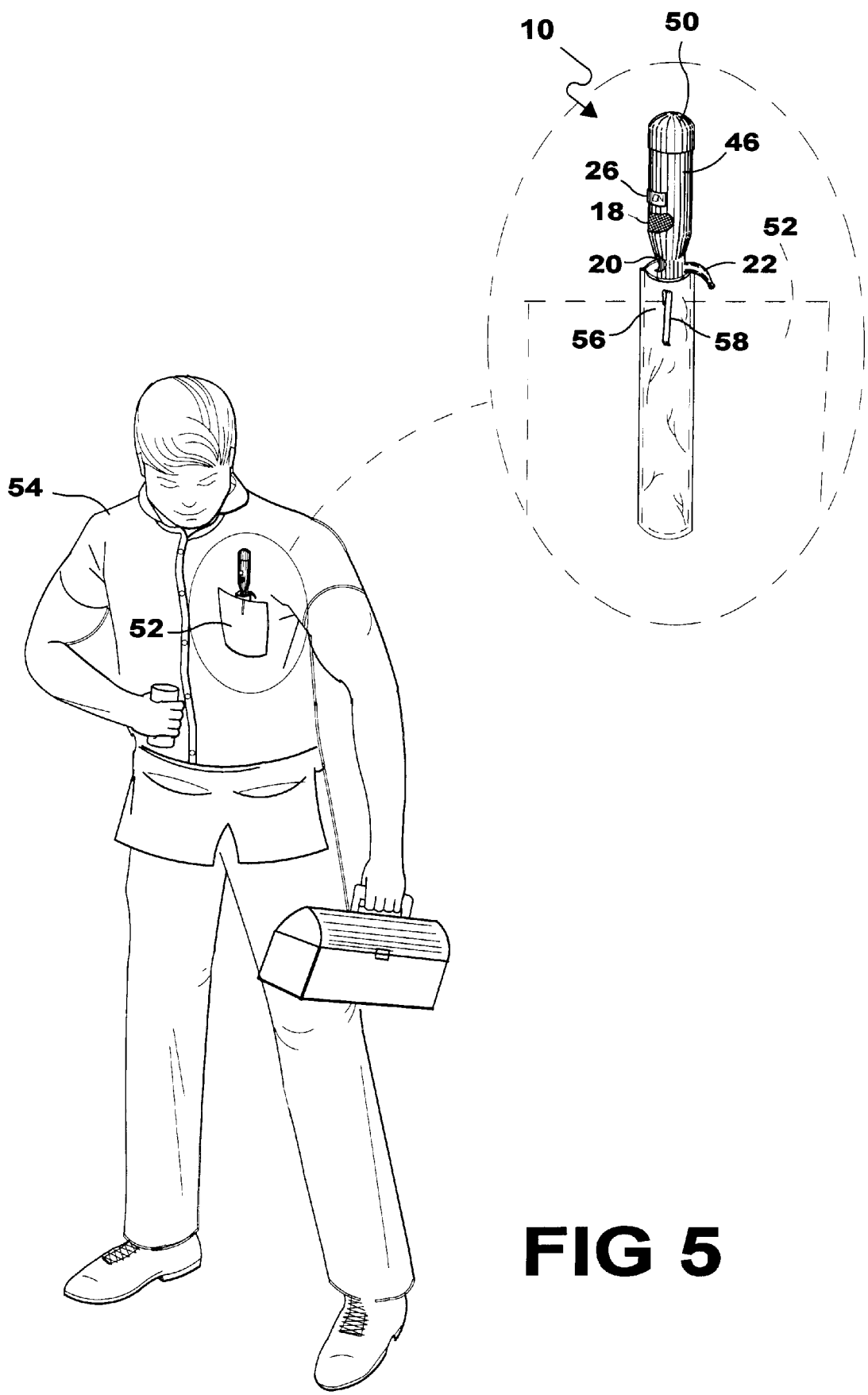
FIG. 5 is a perspective view of the thermoelectric cooling stirrer of the present invention positioned in a pocket of a user.
Figure 6:
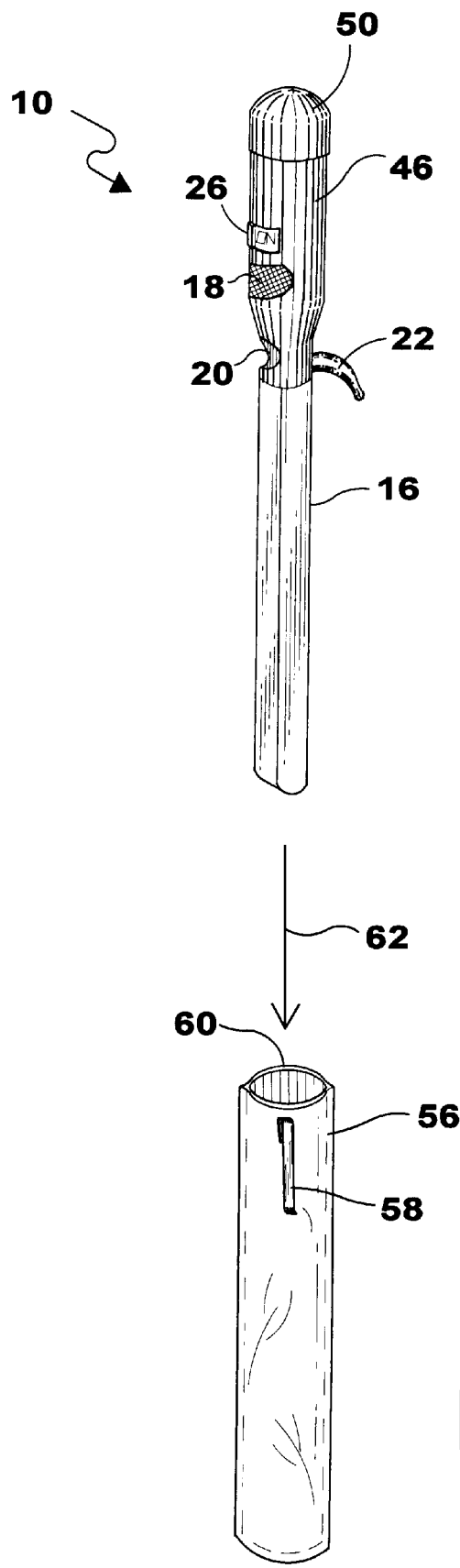
FIG. 6 is a perspective view of the thermoelectric cooling stirrer of the present invention and a carrying case for retaining the stirrer therein.

FIG. 5 illustrates the thermoelectric cooling stirrer 10 being selectively secured in a pocket 52 of a user 54 when not in use. The thermoelectric cooling stirrer 10 is positioned within a case 56. The case 56 is able to retain the thermoelectric cooling stirrer 10 therein and includes a clip 58 extending from an outer side thereof for removably securing the case 56 and its contents to an item of clothing such the pocket 52 of the user 54. An exploded view of the thermoelectric cooling stirrer 10 and the case 56 is illustrated in FIG. 6. The thermoelectric cooling stirrer 10 is positioned in the case 56 by inserting the thermoelectric cooling stirrer 10 through an entrance 60 in the case 56 in a direction indicated by the arrow labeled with the numeral 62.

Figure 7:
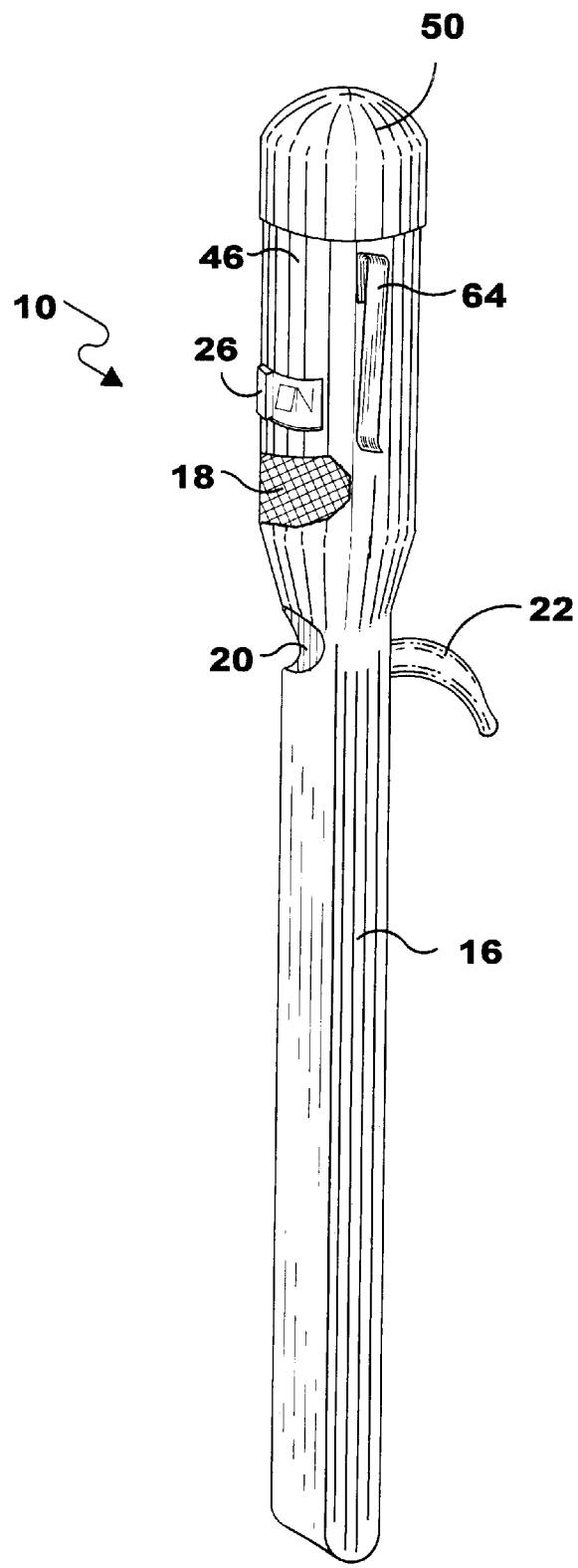
FIG. 7 is a perspective view of the thermoelectric cooling stirrer of the present invention including a clip on an outer side thereof for releasably securing the stirrer to an article of clothing of a user.

Alternatively, the thermoelectric cooling stirrer 10 may include a clip 64 positioned on the top side 46 of the housing 16 as shown in FIG. 7. The positioning of the clip 64 on the top side 46 of the housing 16 will eliminate the need for the case 56 and allow the clip 64 to be directly releasably secured to an article of clothing of the user.

The operation of the thermoelectric cooling stirrer 10 will now be described with reference to the figures. In operation, the thermoelectric cooling stirrer 10 is positioned in a container including a liquid or substance desired to be cooled. The thermoelectric cooling stirrer 10 is stabilized in position by the clip 22 forming a releasable engagement with a rim of the container. The clip 22 will extend partially over the edge or rim of the container thus preventing the thermoelectric cooling stirrer 10 from falling into the container and being totally submerged in the liquid or substance.

Once positioned, the power switch 26 is activated to connect the fan 36 and the thermoelectric devices 41 with the power source 48. The application of power to the fan 36 causes the fan 36 to turn on and draw air into the conduit 38 through the air intake port 18. At the same time the thermoelectric cooling devices 41 are activated such that the cool side of the thermoelectric devices 41 will cool down and the hot side 45 of the thermoelectric devices 41 will heat up. The cool side 47 of the thermoelectric devices is positioned on the outer surface of the housing and begins to cool down when power is applied thereto. As the cool side 47 cools, it begins to absorb the heat in the liquid. The heat absorbed by the thermoelectric devices 41 will be passed on to the air passing through the conduit 38. As the air passes through the conduit 38 and out through the output port 20 it carries the absorbed heat therewith. As the heat is carried out through the output port 20 the liquid or substance will be caused to cool down.

It should also be noted that by reversing the polarity of the power source, the cool side 47 of the thermoelectric devices 41 will be caused to heat up due to the Peltier effect. As the cool side 47 heats up it begins to pass heat on to the liquid in which it is placed and thus raises the temperature of the liquid, such as tea and coffee. In this instance, current is applied, by the power source 48 located within the stirrer 10, to the thermoelectric devices 41 which are sandwiched between ceramic plates forming the adjacent walls 76 which are themselves encased within the external shell of the device 10. The power supplied to the thermoelectric devices 41 will heat the cool side thereof. The air having traveled longitudinally through the conduit 38 provides the heat that will be expelled to the exterior by the thermoelectric devices 41 thereby raising the temperature of the liquid. It must be noted that if it is desired to use the opposite effect to manufacture a heater, for effects of optimal functioning the hot side 45 of the thermoelectric devices 41 must face the outside towards the liquid that is to be heated.

For optimal operation of the thermoelectric cooling stirrer 10, the power supply should supply approximately 1800 watts of power in order to cool a 355 ml can of soda from a temperature of 30° C. to 5° C. in 20 seconds. The power source should thus be able to provide such power to the thermoelectric cooling stirrer 10 to allow for approximately 40–50 uses. Furthermore, the power source may be rechargeable. The preferred power source would be a battery which is able to fit within the top section 46 of the housing 16.

The external protector cap 43 should be a conductive material such as a metal, metal alloy or the like which is able to absorb the heat within the beverage. Furthermore, the material forming the housing 16 should not deposit any toxic materials within the beverage when placed therein thereby preventing contamination of the beverage.

From the above description it can be seen that the thermoelectric cooling stirrer of the present invention is able to overcome the shortcomings of prior art devices by providing a thermoelectric cooling stirrer which is able to quickly cool the contents of a glass, can, bottle or other beverage containers in which it is inserted. The thermoelectric cooling stirrer includes a power source and appropriate controlling means for enabling and disabling said cooling system. The thermoelectric cooling stirrer further includes a conduit for dissipation of heat after the device has been activated and a fan placed within the conduit for rapidly expelling the conduit of heated air after the device has been activated. The thermoelectric cooling stirrer can also be repeatedly reused by replacing or recharging the batteries. Furthermore, the thermoelectric cooling stirrer of the present invention is simple and easy to use and economical in cost to manufacture.

It will be understood that each of the elements described above, or two or more together may also find a useful application in other types of methods differing from the type described above.

While certain novel features of this invention have been shown and described and are pointed out in the annexed claims, it is not intended to be limited to the details above. Since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. A thermoelectric cooling stirrer for cooling a substance, said thermoelectric cooling stirrer comprising:

a) a housing formed of a thermoelectric device for absorbing heat from the substance in which the stirrer is positioned, said housing being rectangular in cross section with a flat center wall joining first and second walls in an H-shaped configuration and having third and fourth walls parallel to and on opposite sides of said center wall, said first, second, third and fourth walls forming said rectangular cross section, and said third and fourth walls spaced from said center wall to form first and second air passages on opposite sides of said center wall;

b) an input port formed in a side of and adjacent an upper end of said housing communicating with said first air passage;

c) an output port formed in a side of said housing below said input port communicating with said second air passage;

d) said first and second passageways communicating with each other adjacent a lower end of said stirrer;

e) a fan positioned in said first passageway adjacent said input port for drawing air into said first passageway, the air traveling through said first and second passageways and carrying heat absorbed by said thermoelectric device through said first and second passageways and said output port and out of said stirrer thereby removing heat from the substance in which said stirrer is positioned;

f) said center wall and said first and second walls being made of thermic isolator material, said third and fourth walls comprising said thermoelectric device, and an external protection film of conductive material coating outside surfaces of said third and fourth walls for protecting said thermoelectric device; and g) a battery mounted in said upper end of said stirrer having means for supplying electricity to said thermoelectric device.

2. The thermoelectric cooling stirrer as recited in claim 1, further comprising a switch for selectively connecting said battery to said fan and thermoelectric device thereby controlling operation of said stirrer.

3. The thermoelectric cooling stirrer as recited in claim 2, further comprising means for changing the polarity of the power source to said thermoelectric device causing said housing to heat the substance in which said stirrer is positioned.

4. The thermoelectric cooling stirrer as recited in claim 1, further comprising a first clip extending from a side of said housing for engaging a rim of a container retaining the substance therein.

5. The thermoelectric cooling stirrer as recited in claim 4, further comprising a retaining clip extending from a side of said housing for releasably securing said housing to an article of clothing of a user.

6. The thermoelectric cooling stirrer as recited in claim 5, wherein said first clip extends at an arc from said housing having a greater radius of curvature than an arc at which said retaining clip extends from said housing.

7. The thermoelectric cooling stirrer as recited in claim 1, further comprising a case for retaining said stirrer when not in use.

8. The thermoelectric cooling stirrer as recited in claim 7, wherein said case further comprises a retaining clip extending from a side thereof for releasably securing said case to an article of clothing of a user.

9. The thermoelectric cooling stirrer as recited in claim 1, further comprising a retaining clip extending from a side of said housing for releasably securing said housing to an article of clothing of a user.

10. The thermoelectric cooling stirrer as recited in claim 1, wherein said thermoelectric device is any P and N type semiconductor material and is sandwiched between ceramic plates.

11. The thermoelectric cooling stirrer as recited in claim 1, wherein said external protector film is any metal, metal alloy or combination thereof.

12. The thermoelectric cooling stirrer as recited in claim 1, wherein said thermic isolator material is plastic.

* * * * *